(12) United States Patent
Delapierre

(10) Patent No.: US 7,059,339 B2
(45) Date of Patent: Jun. 13, 2006

(54) PYROTECHNICALLY ACTUATED MICROVALVE

(75) Inventor: Gilles Delapierre, Seyssins (FR)

(73) Assignee: Commissariat a l'Energie Atomique, Paris (FR)

( * ) Notice: Subject to any disclaimer, the term of this patent is extended or adjusted under 35 U.S.C. 154(b) by 310 days.

(21) Appl. No.: 10/376,622

(22) Filed: Mar. 3, 2003

(65) Prior Publication Data

US 2003/0168097 A1    Sep. 11, 2003

(30) Foreign Application Priority Data

Mar. 11, 2002   (FR)   .................... 02 03016

(51) Int. Cl.
*F16K 17/14*   (2006.01)
(52) U.S. Cl. .................... 137/68.13; 137/833
(58) Field of Classification Search ............ 137/68.13, 137/67, 833; 251/366
See application file for complete search history.

(56) References Cited

U.S. PATENT DOCUMENTS

| | | | | |
|---|---|---|---|---|
| 2,441,894 A | * | 5/1948 | Mennecier | ................ 137/68.13 |
| 3,111,133 A | * | 11/1963 | Fulton et al. | ............ 137/68.13 |
| 3,202,162 A | * | 8/1965 | Eckardt et al. | .......... 137/68.13 |
| 3,260,272 A | * | 7/1966 | Eckardt | ................ 137/68.13 |
| 3,332,432 A | * | 7/1967 | Marsh | ..................... 137/68.13 |
| 3,358,961 A | * | 12/1967 | Montgomery et al. | ... 137/68.13 |
| 3,483,695 A | | 12/1969 | Olsen | |
| 3,548,848 A | * | 12/1970 | Stichling | ................. 137/68.13 |
| 3,836,167 A | * | 9/1974 | Wilson | .................... 137/68.13 |
| 4,111,221 A | | 9/1978 | Olsen | |
| 4,619,284 A | * | 10/1986 | Delarue et al. | ............... 137/67 |
| 6,080,248 A | * | 6/2000 | Finck et al. | ............... 149/19.6 |
| 6,284,195 B1 | | 9/2001 | Lai et al. | |
| 6,321,654 B1 | * | 11/2001 | Robinson | .................... 102/251 |

FOREIGN PATENT DOCUMENTS

WO          WO 98/22719          5/1998

OTHER PUBLICATIONS

Dufour M. et al., "A comparison between micromachined pressure sensors using quartz or silicon vibrating beams", Sensors and Actuators, Elsevier Sequoia, Lausanne, Switzerland, vol. A34, No. 3, Sep. 1, 1992, pp. 201-209.

\* cited by examiner

*Primary Examiner*—John Rivell
(74) *Attorney, Agent, or Firm*—Oliff & Berridge, PLC

(57) ABSTRACT

The microvalve comprises a mini-piston moving due to the thrust of gases given off by firing of a pyrotechnic charge and comprising an aperture designed to enable communication to be established between ends of microchannels of a microfluidic component. When the ends between which communication is to be established open out onto a face of a first planar substrate, the mini-piston is formed in a second planar substrate, adjoined to the first, and comprises a part that is mobile in translation or in rotation in the plane of the second substrate. If a transverse slot is arranged between the ends of the microchannels between which communication is to be established, the mini-piston comprises a rod designed to slide in the slot and the aperture is formed by a transverse orifice formed in the rod of the mini-piston.

8 Claims, 7 Drawing Sheets

PYROTECHNICALLY ACTUATED MICROVALVE

BACKGROUND OF THE INVENTION

The invention relates to a microvalve designed to enable or prevent communication of ends of microchannels of a microfluidic component under the control of a charge of pyrotechnic material.

STATE OF THE ART

Biological analyses make use of a succession of elementary biological reactions. Implementation thereof currently requires several workstations corresponding to different elementary stages of an analysis protocol. This involves a large number of handling operations and consequently a non-negligible error factor, a lengthy analysis time, a large consumption of reagents and samples, and therefore a high cost per analysis.

To reduce costs and simplify implementation of such analyses, it has been proposed to integrate all the stages of the analysis protocol in a single microsystem. Microtechnologies make it possible to achieve micropumps, microvalves, micromotors, microfilters and mixers able to be integrated in a microfluidic device comprising reaction chambers and/or microreservoirs interconnected by a network of microchannels.

Microvalves can be used in a microfluidic component comprising microchannels and/or microreservoirs and/or microreactors to enable or prevent communication between the different microchannels, microreservoirs or microreactors.

U.S. Pat. No. 6,168,948 describes a genetic analysis microsystem, microlaboratory or DNA chip, integrating the whole series of nucleic acid analysis steps on a surface the size of a credit card. To manage fluid flows in the microchannels, this microlaboratory essentially uses as microactuators microvalves designed to open a channel in a preset step of the analysis. The microactuators can also maintain a chamber in a vacuum and, under the effect of an opening order, cause it to be filled with a fluid. The microvalves, comprising a deformable membrane, can be actuated by application of a vacuum or an external pressure, electromagnetically, electrostatically or by coupling with a piezo-electric microactuator.

The different types of known microvalves all present major drawbacks for applications using microfluidic components constituting microlaboratories or DNA chips. These single-use components are in fact designed to be used at a patient's home, in a doctor's surgery, on the site of an accident, etc. They therefore have to be as compact as possible with an external control system reduced to the strict minimum.

Furthermore, the document WO-A-9,822,719 and the corresponding U.S. Pat. No. 6,247,485 describe a transdermal medicine administration apparatus using three pyrotechnic microactuators. Two of these microactuators are designed to break a thin zone of a solid membrane to form orifices for passage of a fluid, whereas the third microactuator is used to inflate an envelope designed to expel the fluid through passage orifices formed by the other two microactuators. This device is complex and contact of the fluid with the pyrotechnic material is not compatible with its use in an analysis microlaboratory in which any pollution of a sample to be analyzed must be avoided.

It is also possible to use a membrane deformed by pressure to blank off a microchannel formed in a substrate and in which a fluid flows.

These different types of microactuators present the drawback of not enabling both micro-channel closing valves and opening valves to be achieved. Yet both these functions are generally indispensable in an analysis device. It can naturally be envisaged to use two different types of microactuators on a single card to achieve on the one hand closing microvalves and on the other hand opening microvalves. Such a solution is however very complicated and consequently very costly, without counting the compatibility problems this would give rise to in the course of the different manufacturing stages.

OBJECT OF THE INVENTION

The object of the invention is to overcome the drawbacks of state-of-the-art microvalves and, more particularly, to enable microvalves designed to be opened and microvalves designed to be closed to be achieved with a single technique. The microvalves must comprise reliable, low-consumption, inexpensive actuating means of simple and rugged design, operational only when an analysis is performed and able to tolerate storage for several years.

According to the invention, this object is achieved by the fact that the microvalve comprises a mini-piston moving due to the thrust of gases given off by firing of the pyrotechnic charge and comprising an aperture designed to achieve said communication.

According to a development of the invention, the microfluidic component microchannels are made in a planar substrate comprising a transverse slot arranged between the ends between which communication is to be established, the mini-piston comprising a rod designed to slide in said slot, the aperture being formed by a transverse orifice formed in the rod of the mini-piston.

According to another development of the invention,
the micro-fluidic component microchannels are achieved in a first planar substrate, the ends between which communication is to be established open out onto a face of said first planar surface,
the mini-piston is formed in a second planar substrate designed to be adjoined to the first planar substrate and comprises a mobile part in the plane of the second substrate,
the aperture is formed in the mobile part of the mini-piston.

The mobile part of the mini-piston can then be mobile in translation or in rotation in the plane of the second substrate.

The mini-piston can also comprise a deformable part integral with the mobile part, deformation of the deformable part perpendicularly to the plane of the second substrate in response to firing of the pyrotechnic charge causing movement of the mobile part.

BRIEF DESCRIPTION OF THE DRAWINGS

Other advantages and features will become more clearly apparent from the following description of particular embodiments of the invention given as non-restrictive examples only and represented in the accompanying drawings in which:

FIGS. 11 to 13 illustrate alternative embodiments of a microvalve according to

FIGS. 9 and 10.

DESCRIPTION OF PARTICULAR EMBODIMENTS

Figure 1:
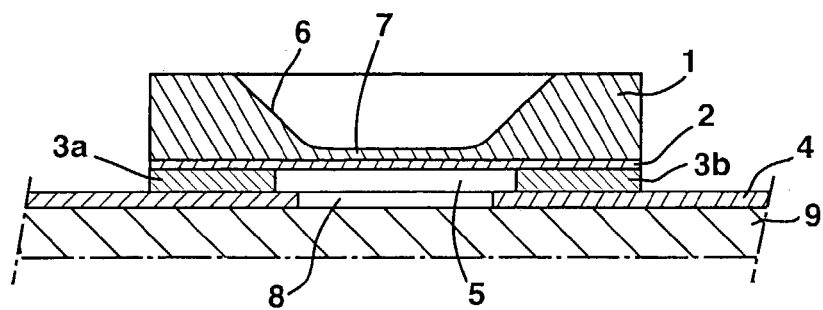
FIGS. 1 and 2 schematically represent, in cross-section, a microvalve according to the prior art respectively before and after actuation.
Figure 2:
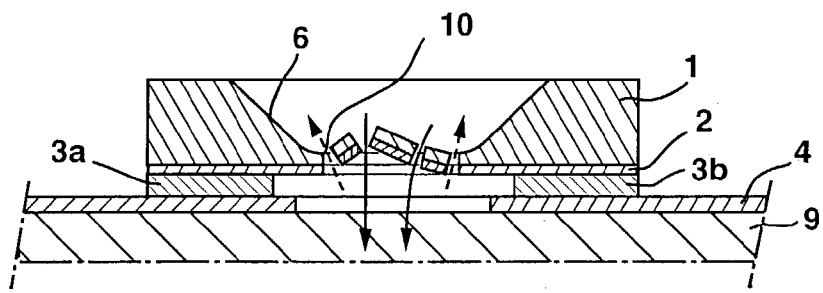

The microvalve according to FIGS. 1 and 2 is designed to be used in a transdermal medicine administration apparatus (WO-A-9,822,719 and the corresponding U.S. Pat. No. 6,247,485). It comprises a substrate 1 made of semiconducting material, for example silicon, supporting an electrical resistor 2 the ends whereof are connected to metal contacts 3a and 3b soldered onto conducting tracks of a printed circuit 4. A charge 5 of combustible material is arranged in the form of a thin film on the electrical resistor 2 between the contacts 3a and 3b. The material of the charge 5 is a pyrotechnic material for example of nitrocellulose type. The substrate 1 comprises a truncated pyramidal crater so as to form at its bottom part a thinner zone 7 adjoined to the resistor 2 above the charge 5. A hole 8 is drilled in the printed circuit 4 facing the thinner zone 7 of the substrate 1. The hole 8 is closed by a layer 9, for example of hydrogel, designed to be charged with an active principle contained in a pocket (not shown) communicating with the crater 6.

Current flow in the electrical resistor 2 causes heat to be given off by Joule effect resulting in the pyrotechnic charge 5 being fired. This charge then gives off a sufficient quantity of gas for the pressure to cause breaking of the thinner zone 7 of the substrate 1 and of the part adjoining the resistor 2, forming passages 10 (FIG. 2) for the gases to escape (dashed line arrows) and for a liquid to pass (unbroken arrows) from the pocket communicating with the crater 6, through the hole 8, to the layer of hydrogel 9, which constitutes for example a reservoir of a transdermal medicine administration apparatus.

Figure 3:
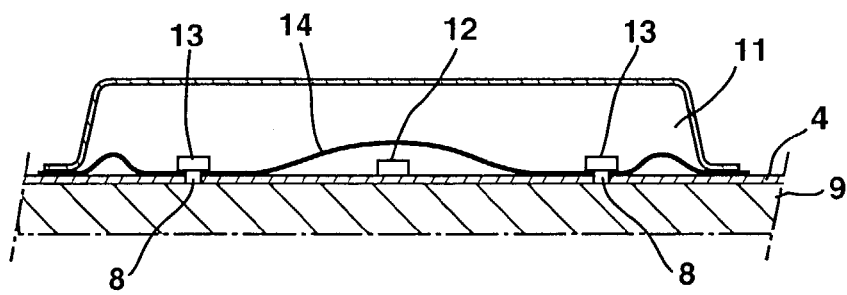
FIGS. 3 and 4 schematically represent a device for filling a reservoir in a transdermal medicine administration apparatus according to the prior art respectively before and after actuation.
Figure 4:
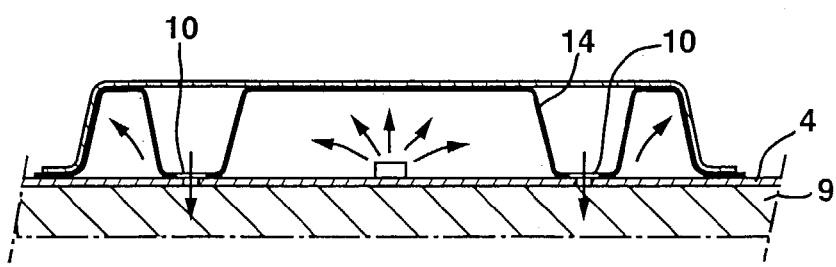

A known transdermal medicine administration apparatus using three microvalves equipped with pyrotechnic micro-actuators is represented in FIGS. 3 and 4. A pocket 11 contains an ionic solution designed to hydrate the hydrogel layer 9 when the three microvalves are actuated by means of a printed circuit foil 4 arranged between the layer 9 and the pocket 11. A first microvalve 12 is fixed to the printed circuit foil 4, in central position, and several microvalves 13 are arranged around the microvalve 12. An inflatable envelope 14 housing the central microvalve 12 is pinched against the printed circuit foil by the microvalves 13 and by the pocket 11.

The microvalves 13 are of the type represented in FIGS. 1 and 2 whereas the microvalve 12 differs by the fact that it doesn't comprise a hole 8. Firing of the combustible charges of the microvalves 13 opens up passages 10 (FIG. 4) between the pocket 11 and the reservoir formed by the layer of hydrogel 9. Firing of the combustible charge of the central microvalve 12 causes breaking of the corresponding thinner zone 7 and the gases given off cause the inflatable envelope 14 to inflate. This envelope then come and occupies a large part of the internal volume of the pocket 11, expelling the ionic solution contained in the pocket 11 through the microvalves 13 and the associated passages 10 formed beforehand by actuation of the microvalves 13.

This device is complex and contact of the fluid contained in the pocket 11 with the pyrotechnic material, the combustion gases of the pyrotechnic material and the debris of the thinner zone 7 of the substrate 1 is not compatible with its use in an analysis micro-laboratory in which any pollution of a sample to be analyzed must be avoided.

Figure 5:
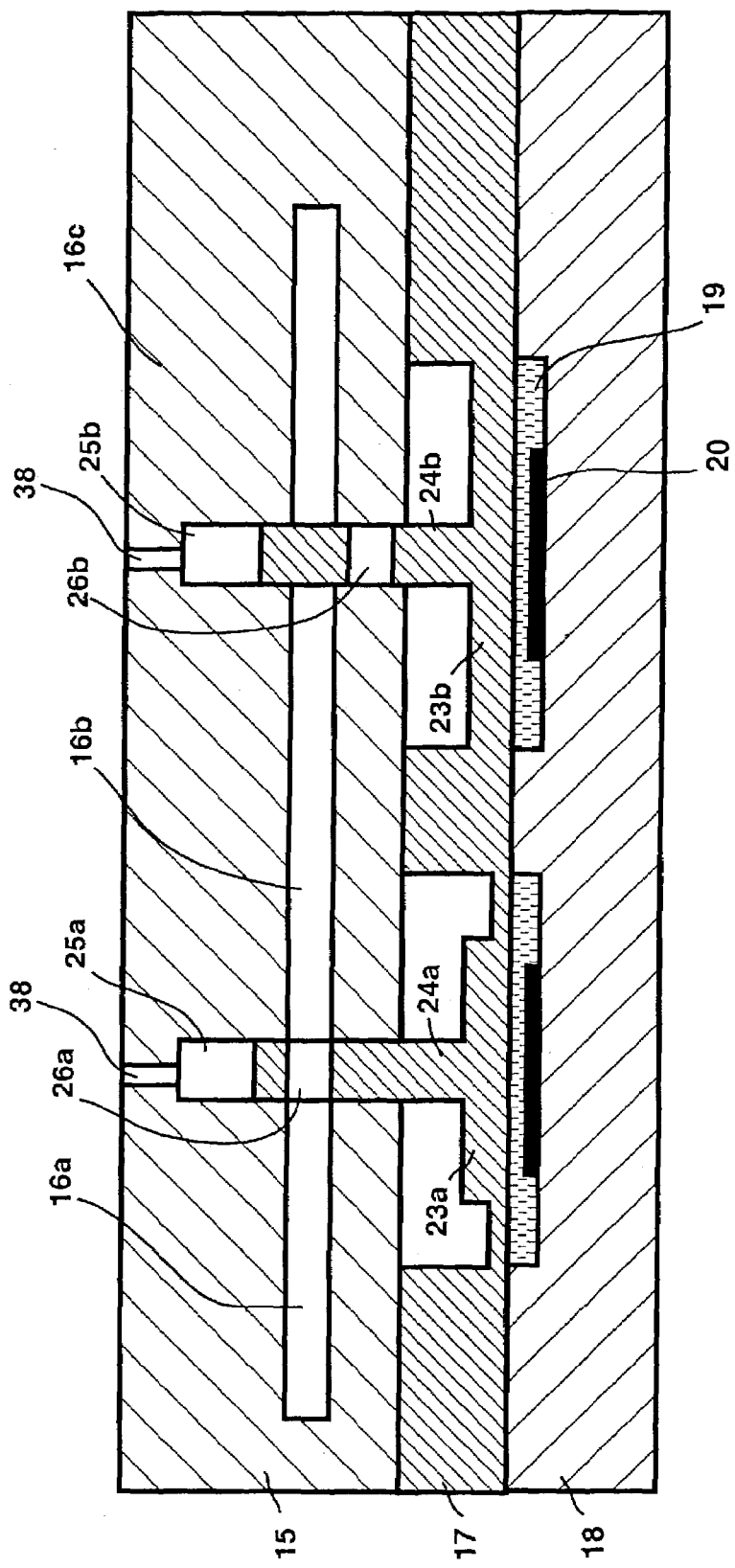
FIG. 5 illustrates in cross-section a microfluidic component comprising a first embodiment of two microvalves according to the invention, one normally open and the other normally closed.

The microfluidic component of FIG. 5 comprises a first embodiment of two microvalves according to the invention, one normally open and the other normally closed. The micro-fluidic component is formed by superposition of three cards each formed by at least one planar substrate and able to be fixedly secured by any suitable means, for example by sticking. A first card 15 comprises the microchannels 16 and/or microreservoirs and/or micoreactors constituting the microfluidic network of the component. It comprises at least a first planar substrate, preferably made of plastic material for example polymer, the microchannels being able to be etched on the surface or on an additional substrate made of plastic material, glass, silicon or quartz, added onto the plastic substrate.

A second card 17 constitutes the valve card. In FIG. 5, it is formed by a substrate wherein two microvalves are formed.

Figure 6:
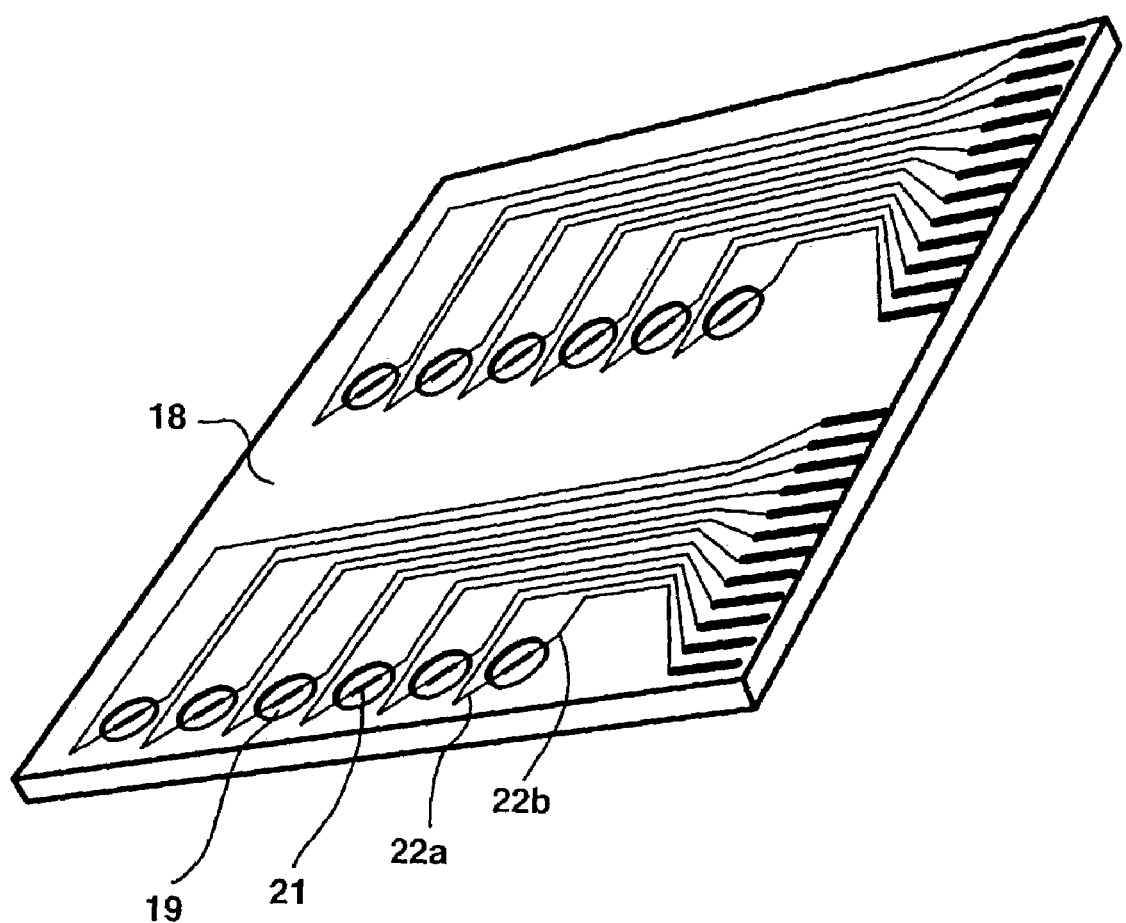
FIG. 6 illustrates an actuating stage able to be used with microvalves according to the invention.

A third card 18 constitutes the actuator stage and comprises a planar substrate, made of silicon, plastic material or glass, in which cavities 19 are formed. A pyrotechnic charge 20 is arranged in each of the cavities 19. Firing of a pyrotechnic charge is performed by any suitable means, for example (FIG. 6) by means of a resistor 21 arranged in each cavity 20 and supplied by two associated conducting tracks 22a and 22b. A pyrotechnic charge 20 is deposited on each resistor 21, for example by screen printing or by localized deposit by means of piezoelectric micropipettes. Each pyrotechnic charge 20 can be fired independently by means of the associated conducting tracks. The pyrotechnic charge firing control circuit is preferably formed on the card 18.

As illustrated in FIG. 5, each pyrotechnic charge 20 is arranged facing a microvalve of the second card 17. Firing of a pyrotechnic charge causes gas to be given off and consequently causes actuation of the associated microvalve.

A microvalve represented in FIG. 5 comprises a mini-piston which moves perpendicularly to the plane of the valve card, upwards in FIG. 5, under the thrust of the gases given off by firing of the associated pyrotechnic charge 20. Each mini-piston comprises a base 23 (23a, 23b) and a rod 24 (24a, 24b). The base 23 is formed by a zone of smaller thickness of the card 17 situated facing a cavity 19 containing a pyrotechnic charge 20. The base of a mini-piston can have a constant thickness (base 23b) or comprise a zone of smaller thickness on its periphery (base 23a) facilitating deformation of the base under the thrust of the gases generated by firing of the pyrotechnic charge 20. The rod 24 of a mini-piston is substantially perpendicular to the base 23 and its free end moves by sliding inside an associated transverse slot 25 (25a, 25b) formed in the card 15. The rods 24 are preferably engaged slightly by force in the corresponding slots 25, which enables tightness of the mini-pistons to be achieved. A vent 38 is preferably situated at the end of each slot 25.

Each rod 24 comprises an aperture formed by a transverse orifice 26 (26a, 26b). Depending on the position of the transverse orifice of the rod with respect to the ends of the microchannels between which communication is to be established, the corresponding microvalve is normally open or closed. Thus, in FIG. 5, a first microvalve (23a, 24a, 26a) is normally open, its transverse orifice 26a being situated, in the corresponding slot 25a, at the level of the opposite ends of the microchannels 16a and 16b between which communication is to be established. The second microvalve (23b, 24b, 26b) is on the other hand normally closed, its transverse orifice 26b being situated, in the corresponding slot 25b, below the level of the opposite ends of the microchannels 16b and 16c between which communication is to be established.

Firing of a pyrotechnic charge 20 causes a gas release exerting a thrust on the associated mini-piston. The base 23 of the mini-piston is then deformed and pushes the corresponding rod 24, upwards in FIG. 5, into the corresponding slot 25. The pressure provided by the gases given off by firing of the pyrotechnic charge is sufficient to overcome the friction due to forced engagement of the rod 24 in the slot 25. The first microvalve (23a, 24a, 26a) closes after the corresponding charge 20 has been fired, the transverse orifice 26a of its rod 24a then having moved upwards and being located above the level of the opposite ends of the microchannels 16a and 16b initially in communication. The second microvalve (23b, 24b, 26b) on the other hand opens after the corresponding charge 20 has been fired, the transverse orifice 26b of its rod 24b then having moved upwards and being located at the level of the opposite ends of the microchannels 16ba and 16c between which communication is to be established.

The cavities 19 are preferably filled with a material, for example resin, to enable a pressure to be exerted on the card 18 when the rods 24 are inserted in the slots 25.

As an example, the diameter of an orifice 26, corresponding substantially to the diameter of the microchannels 16, is about from a few tens to a few hundreds of micrometers and the width of the base 23 of a mini-piston, corresponding substantially to the width of a cavity 19, is about one millimeter.

Thus, the valve card 17 comprises microvalves designed to be opened and microvalves designed to be closed which can be achieved with one and the same technique. Customization of a microvalve (to be opened or closed) is performed very easily in the course of manufacturing simply by suitable positioning of the corresponding transverse orifice 26.

Figure 7:
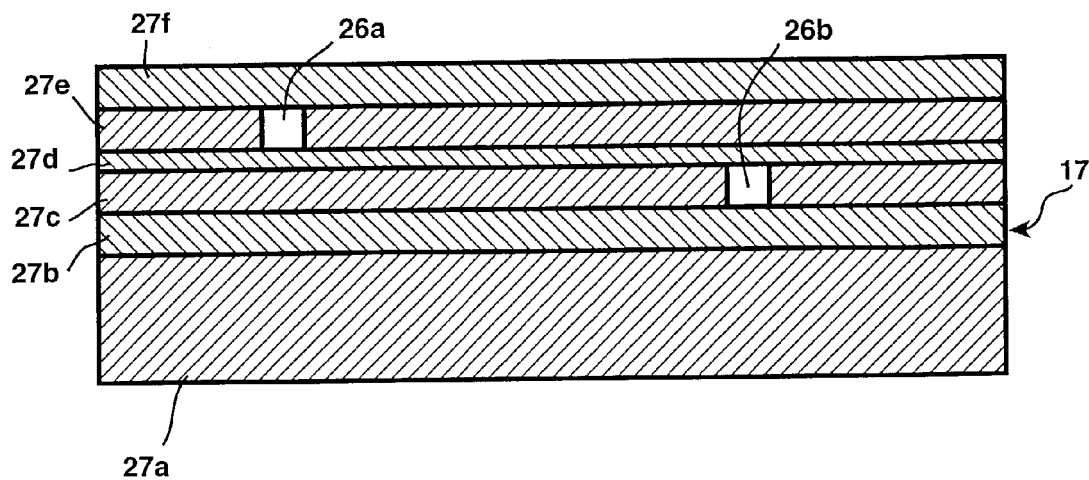
FIGS. 7 and 8 illustrate a particular embodiment of mini-pistons of microvalves according to FIG. 5.
Figure 8:
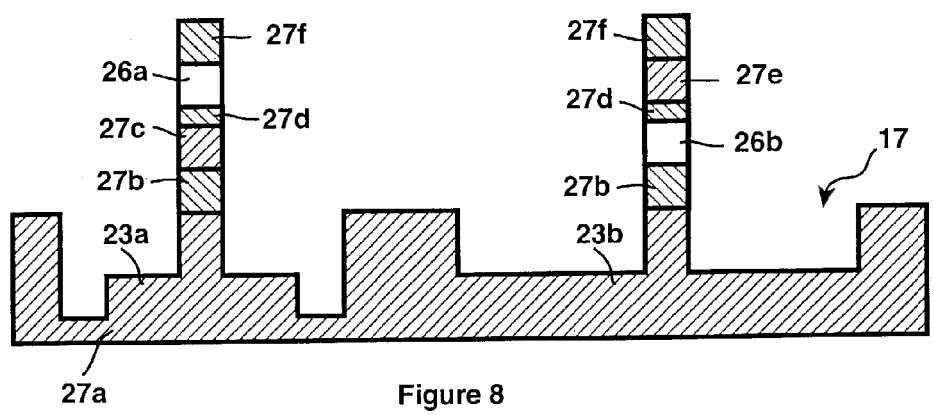

The various elements constituting the valve card 17 can be achieved by machining and/or by molding of the substrate. FIGS. 7 and 8 illustrate a preferred embodiment of the valve card 17. In a first stage, a stack of flat layers 27 is made. In FIG. 7, the stack comprises six layers 27a to 27f made of plastic material or silicon. The stack of layers is then machined in the manner represented in FIG. 8 to form the valve card 17 of FIG. 5. Thus, the bases 23a and 23b of the mini-pistons are formed in the first, thickest, layer 27a. The layers 27b and 27d form intermediate layers of different thicknesses making it possible to situate precisely, in the heightwise direction, the layers 27e and 27c in which pass-through orifices are respectively formed, the width whereof is greater than or equal to the width of the rod of a mini-piston and respectively constituting, after the stack has been machined, the orifices 26a and 26b of the rods 24a and 24b of the mini-pistons. The top layer 27f of the stack constitutes the free ends of the rods.

Such an embodiment is particularly simple. Only flat layers are in fact molded and stacking thereof enables the position of the orifices of the mini-piston rods to be defined precisely. In a preferred embodiment, the rods 24 have a rectangular cross-section as seen in top view.

Figure 9:
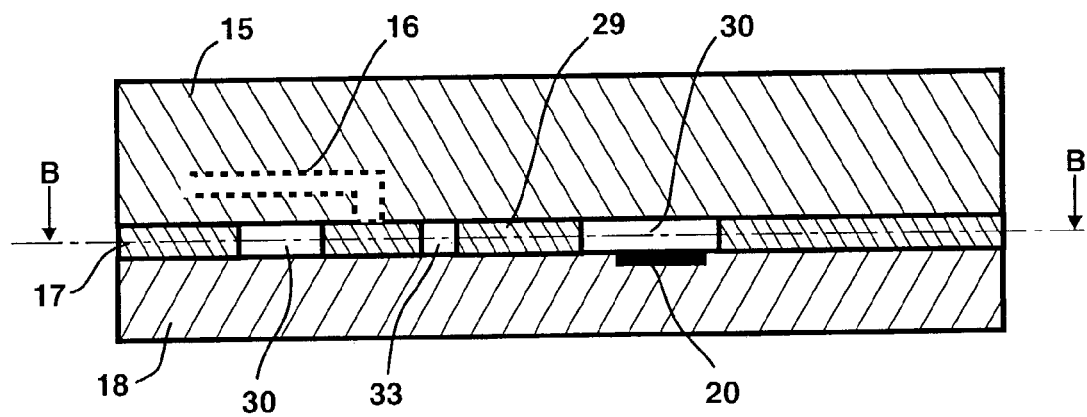
FIG. 9 represents a cross-sectional view along A—A of a second embodiment of a microvalve according to the invention.
Figure 10:
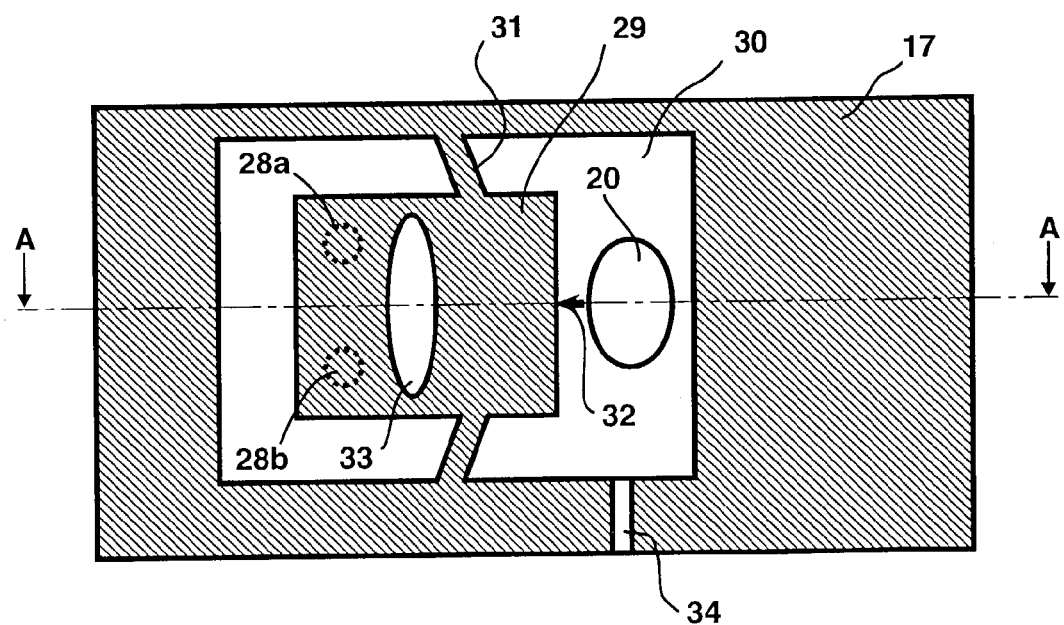
FIG. 10 represents the microvalve of FIG. 9 in cross-section along B—B.

A second embodiment of a microvalve according to the invention is illustrated in FIGS. 9 and 10. As previously, the microfluidic component comprises a first card 15 comprising the microchannels 16 and/or microreservoirs and/or microreactors constituting the micro-fluidic system of the component, a valve card 17 and a third card 18 constituting the actuating stage. In this embodiment, the ends 28 of the microchannels 16 between which communication is to be established open out onto the bottom face (FIG. 9) of the planar substrate constituting the first card 15.

The valve card 17 comprises a mini-piston 29 able to move in a recess 30 of the valve card 17, in the plane of the valve card, i.e. perpendicularly to the ends 28 of the microchannels. In FIG. 10, the mini-piston 29 is joined to the periphery of the recess 30 by thin joining zones 31. A pyrotechnic charge 20 is arranged, in the card 18 constituting the actuating stage, facing one end of the recess 30, on the right of the mini-piston 29 in FIGS. 9 and 10. Firing of the pyrotechnic charge causes release of the gas, the pressure whereof is exerted on the mini-piston and causes movement of the latter to the left in FIGS. 9 and 10, in the direction indicated by the arrow 32, the joining zones 31 deforming to allow this movement. The mini-piston comprises an aperture 33.

In FIGS. 9 and 10, the microvalve represented is normally closed. The mini-piston 29 normally prevents any communication between the ends 28a and 28b of the microchannels between which communication is to be established. The locations of the ends 28a and 28b are represented in broken lines in FIG. 10. They are arranged perpendicularly to the axis of movement of the mini-piston 29. When this piston is moved to the left after firing of the pyrotechnic charge, the aperture 33 of oblong shape and substantially perpendicular to the direction of movement of the piston 29, then comes to face the two ends 28a and 28b and establishes communication between the latter. A calibrated vent 34 is preferably provided in the card 17 to enable the gases to be removed after the microvalve has been actuated. The vent 34 is calibrated so that the overpressure generated very quickly after firing of the pyrotechnic charge 20 is sufficient to move the mini-piston 29 but then decreases quickly. The gases given off thus do not have time to reach the channels containing the reagents. The tightness between the actuating card 18 and the card 15 containing the microchannels therefore does not have to be as high as in the absence of a vent.

Figure 11:
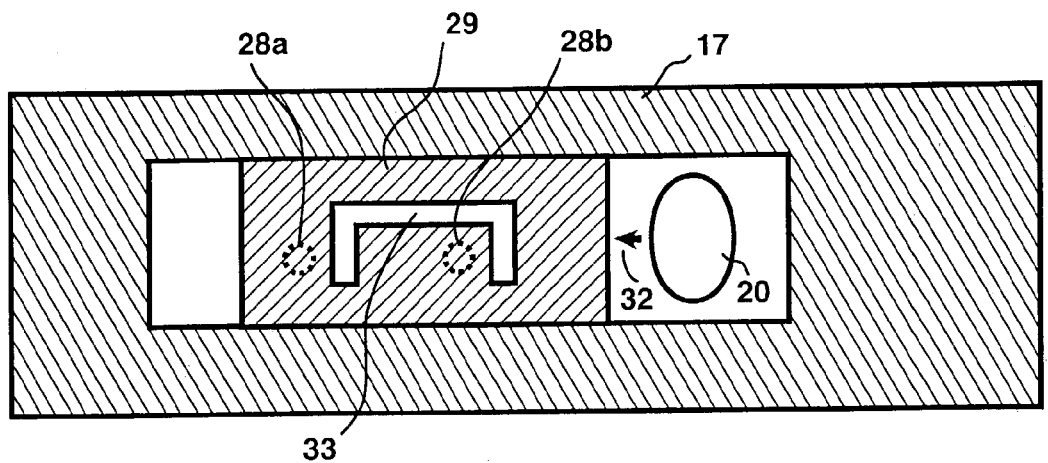

Various forms of mini-pistons and apertures can be envisaged. In the alternative embodiment represented in FIG. 11, the joining zones 31 are eliminated and the piston 29 is engaged slightly by force in the recess 30. The locations of the ends 28a and 28b can be substantially parallel to the direction of movement of the mini-piston (arrow 32). In this case, the aperture 33 is substantially parallel to the direction of movement of the piston. In the particular embodiment represented in FIG. 11, the aperture 33 is substantially U-shaped, the base of the U being parallel to the axis passing via the ends 28a and 28b and the ends of the branches of the U being designed to face the ends 28a and 28b of the microchannels after the microvalve has been actuated.

Figure 12:
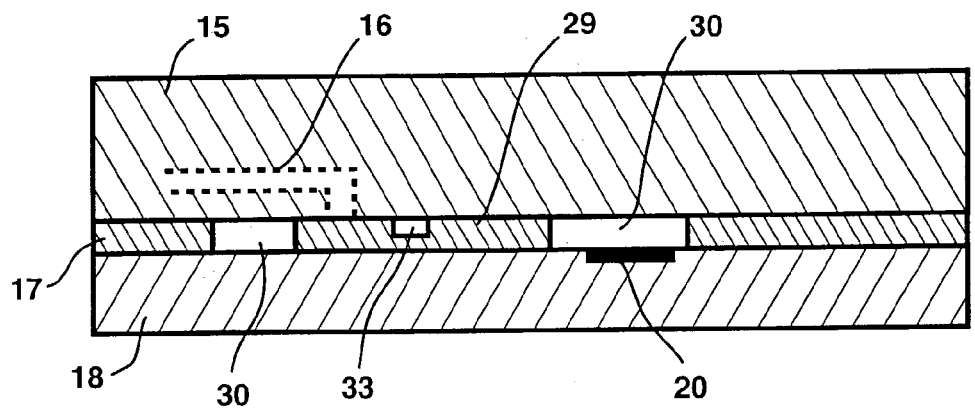

The aperture 33 represented, in FIG. 9 passes through the mini-piston 29 perpendicularly to the plane of the valve card 17. In the alternative embodiment illustrated in FIG. 12, the aperture 33 is a blind, not a pass-through, aperture.

Figure 13:
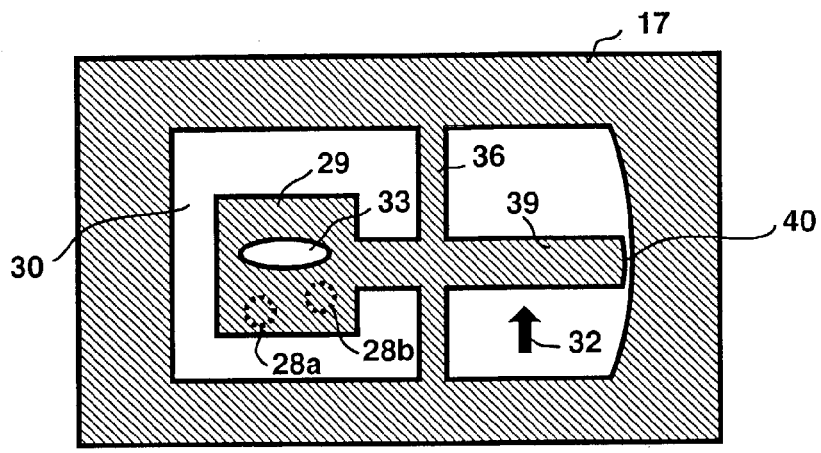

In another alternative embodiment represented in FIG. 13, the movement of the mini-piston 29 is not linear, as in the previously described embodiments, but rotary. The shape and disposition of the aperture 33, arranged at a first end of the mini-piston, are adapted accordingly. In FIG. 13, the mini-piston is joined to the periphery of the recess 30 by a transverse joining bar 36 integral to the central part of the mini-piston. The mini-piston is movable in rotation around a center of rotation situated at the intersection of the mini-piston and the joining bar 36. The pyrotechnic charge 20 is then arranged in such a way that the gas release exerts a pressure (arrow 32) on a second end of the mini-piston causing deformation of the joining bar 36 and rotation of the mini-piston. The second end of the mini-piston is situated at a calibrated distance from the opposite wall of the recess 30, thus bounding a passage 40 serving the same purpose as the vent 34 in the microvalve according to FIG. 10.

Figure 14:
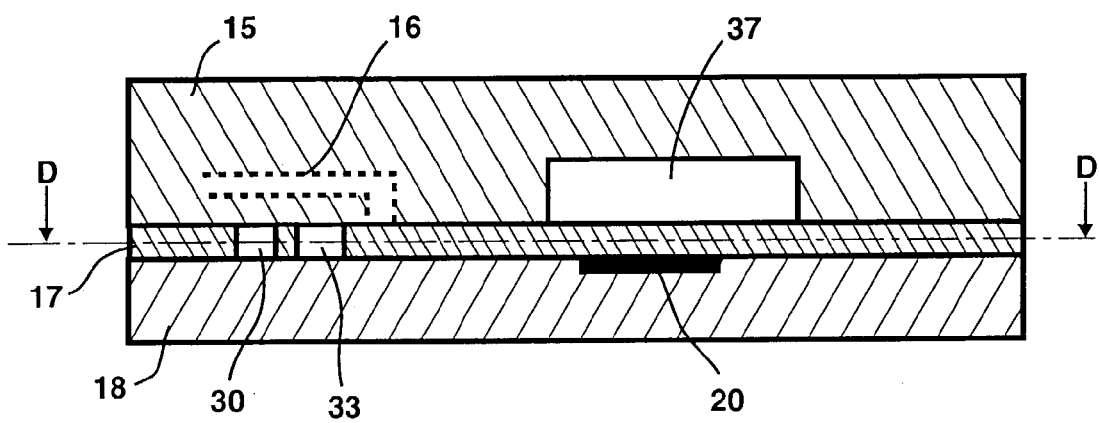
FIG. 14 represents a cross-sectional view along C—C of a third embodiment of a microvalve according to the invention.
Figure 15:
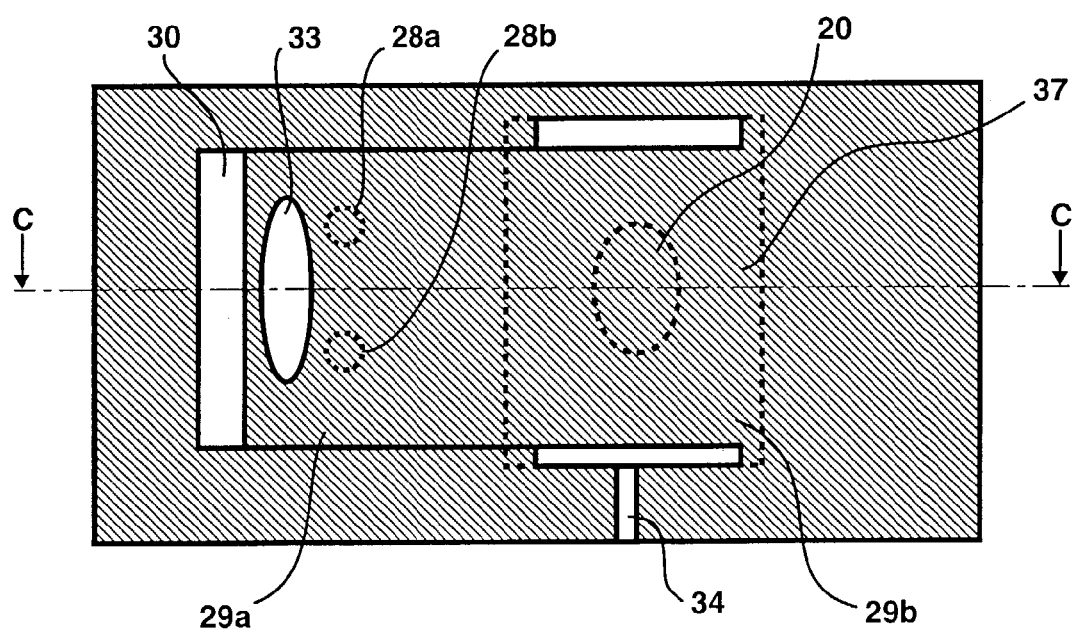
FIG. 15 represents the microvalve of FIG. 14 in cross-section along D—D.

A third embodiment of a microvalve according to the invention is illustrated in FIGS. 14 and 15. As in the second embodiment (FIGS. 9 to 12), the mini-piston 29 comprises at its free end a mobile part 29a wherein the aperture 33 is formed and which moves in a direction parallel to the plane of the card 17. The mini-piston comprises in addition a deformable part 29b integral to the mobile part 29a. Deformation of the deformable part takes place perpendicularly to the plane of the card 17 in a zone situated facing the pyrotechnic charge 20. To enable this deformation, the card 15 containing the micro-channels 16 comprises a cavity 37 situated facing the pyrotechnic charge 20 the location whereof is represented in a broken line in FIG. 15. Firing of the pyrotechnic charge causes a gas release which exerts a pressure on the deformable part 29b in a direction perpendicular to the plane of the card 17. This deformation of the deformable part of the mini-piston causes the mobile part 29a to withdraw into the recess 30. The mobile part therefore moves to the right in FIG. 15, thus bringing the aperture 33 to face the ends 28a and 28b of the microchannels between which communication is to be established. The location of the aperture 33 in the mobile part 29a of the mini-piston is adapted accordingly.

The microvalves illustrated in FIGS. 9 to 15 are normally closed microvalves that open when firing of the associated pyrotechnic charge 20 takes place. To achieve a normally open microvalve that closes when firing of the associated pyrotechnic charge 20 takes place, the relative position of the aperture 33 and of the locations corresponding to the ends 28a and 28b merely have to be modified so that the aperture 33 establishes communication between the ends 28a and 28b before the microvalve is actuated.

Whereas the first embodiment (FIGS. 5, 7 and 8), to constitute the valve card, requires manufacture of fairly complex three-dimensional parts with transverse orifices and engagement by force which may be delicate to implement with a good manufacturing efficiency, the second and third embodiments (FIGS. 9 to 15) enable planar techniques only to be used resulting in simpler and consequently less expensive manufacturing. The invention presents the advantage of keeping the microvalve in the open or closed position after actuation without it being necessary to sustain the actuating force, i.e. the pressure given off by the pyrotechnic charge.

The invention claimed is:

1. A microvalve for enabling or preventing communication of ends of microchannels of a microfluidic component under a control of a charge of pyrotechnic material, said micro-valve comprising:
a mini-piston moving due to a thrust of gases given off by firing a pyrotechnic charge and comprising an aperture designed to achieve said communication, wherein the microfluidic component microchannels are made in a planar substrate comprising a transverse slot arranged between the ends between which communication is to be established, said mini-piston comprising a rod designed to slide within said slot, the aperture being formed by a transverse orifice formed in the rod of the mini-piston and the rod of the mini-piston is formed by machining a stack of flat layers, the transverse orifice of the rod of the mini-piston being formed by an orifice passing through one of the layers and having a width greater than or equal to a width of the rod.

2. The microvalve according to claim 1, wherein the microvalve being normally open, the transverse orifice of the rod of the mini-piston normally establishes communication between the ends situated on each side of the slot, and the rod prevents said communication after the pyrotechnic charge has been fired.

3. The microvalve according to claim 2, wherein the microvalve being normally closed, the rod normally prevents communication between the ends situated on each side of the slot, and the transverse orifice of the rod of the mini-piston establishes communication between the ends after the pyrotechnic charge has been fired.

4. The microvalve according to claim 1, wherein the stack of layers comprises intermediate layers, an arrangement of different layers in the stack determining a position of the orifice in the rod.

5. The microvalve according to claim 1, wherein the layers are made of plastic material.

6. A microvalve for enabling or preventing communication of ends of microchannels of a microfluidic component under a control of a charge of pyrotechnic material, said micro-valve comprising:
a mini-piston moving due to a thrust of gases given off by firing a pyrotechnic charge and comprising an aperture designed to achieve said communication, wherein a rod of the mini-piston is formed by machining a stack of flat layers, a transverse orifice of the rod of the mini-piston being formed by an orifice passing through one of the layers and having a width greater than or equal to a width of the rod.

7. The microvalve according to claim 6, wherein the stack of layers comprises intermediate layers, an arrangement of different layers in the stack determining a position of the orifice in the rod.

8. The microvalve according to claim 6, wherein the layers are made of plastic material.

* * * * *